(12) United States Patent
Lee et al.

(10) Patent No.: US 9,548,303 B2
(45) Date of Patent: Jan. 17, 2017

(54) FINFET DEVICES WITH UNIQUE FIN SHAPE AND THE FABRICATION THEREOF

(71) Applicant: TAIWAN SEMICONDUCTOR MANUFACTURING COMPANY, LTD., Hsin-Chu (TW)

(72) Inventors: Yi-Jing Lee, Hsinchu (TW);
Cheng-Hsien Wu, Hsinchu (TW);
Chih-Hsin Ko, Fongshan (TW);
Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 14/207,848

(22) Filed: Mar. 13, 2014

(65) Prior Publication Data

US 2015/0263003 A1    Sep. 17, 2015

(51) Int. Cl.
*H01L 27/12*      (2006.01)
*H01L 27/092*     (2006.01)
*H01L 21/8238*    (2006.01)
*H01L 21/84*      (2006.01)

(52) U.S. Cl.
CPC ... *H01L 27/0922* (2013.01); *H01L 21/823807* (2013.01); *H01L 21/823821* (2013.01); *H01L 21/845* (2013.01); *H01L 27/0924* (2013.01); *H01L 27/1211* (2013.01)

(58) Field of Classification Search
CPC ............. H01L 27/0924; H01L 27/0922; H01L 27/1211
See application file for complete search history.

(56) References Cited

U.S. PATENT DOCUMENTS

| 9,224,736 B1* | 12/2015 | Ching | H01L 27/0924 |
| 2006/0113603 A1* | 6/2006 | Currie | H01L 27/1203 257/368 |
| 2010/0163971 A1* | 7/2010 | Hung | H01L 29/66795 257/327 |
| 2015/0076558 A1* | 3/2015 | Lee | H01L 29/16 257/190 |
| 2015/0144998 A1* | 5/2015 | Ching | H01L 29/785 257/190 |
| 2015/0311336 A1* | 10/2015 | Ching | H01L 27/0922 257/192 |
| 2015/0340365 A1* | 11/2015 | Han | H01L 27/0924 257/369 |

* cited by examiner

*Primary Examiner* — Julio J Maldonado
*Assistant Examiner* — Cory Eskridge
(74) *Attorney, Agent, or Firm* — Haynes and Boone, LLP

(57) ABSTRACT

A semiconductor device includes a PMOS FinFET and an NMOS FinFET. The PMOS FinFET includes a substrate, a silicon germanium layer disposed over the substrate, a silicon layer disposed over the silicon germanium layer, and a PMOS fin disposed over the silicon layer. The PMOS fin contains silicon germanium. The NMOS FinFET includes the substrate, a silicon germanium oxide layer disposed over the substrate, a silicon oxide layer disposed over the silicon germanium oxide layer, and an NMOS fin disposed over the silicon oxide layer. The NMOS fin contains silicon. The silicon germanium oxide layer and the silicon oxide layer collectively define a concave recess in a horizontal direction. The concave recess is partially disposed below the NMOS fin.

20 Claims, 15 Drawing Sheets

FINFET DEVICES WITH UNIQUE FIN SHAPE AND THE FABRICATION THEREOF

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, traditional methods of fabricating FinFET devices may still have various shortcomings. These shortcomings include, but are not limited to, defects related to certain process flows, small epitaxial growth process windows, unsatisfactory device performance, higher costs, etc. Therefore, while existing methods of fabricating FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
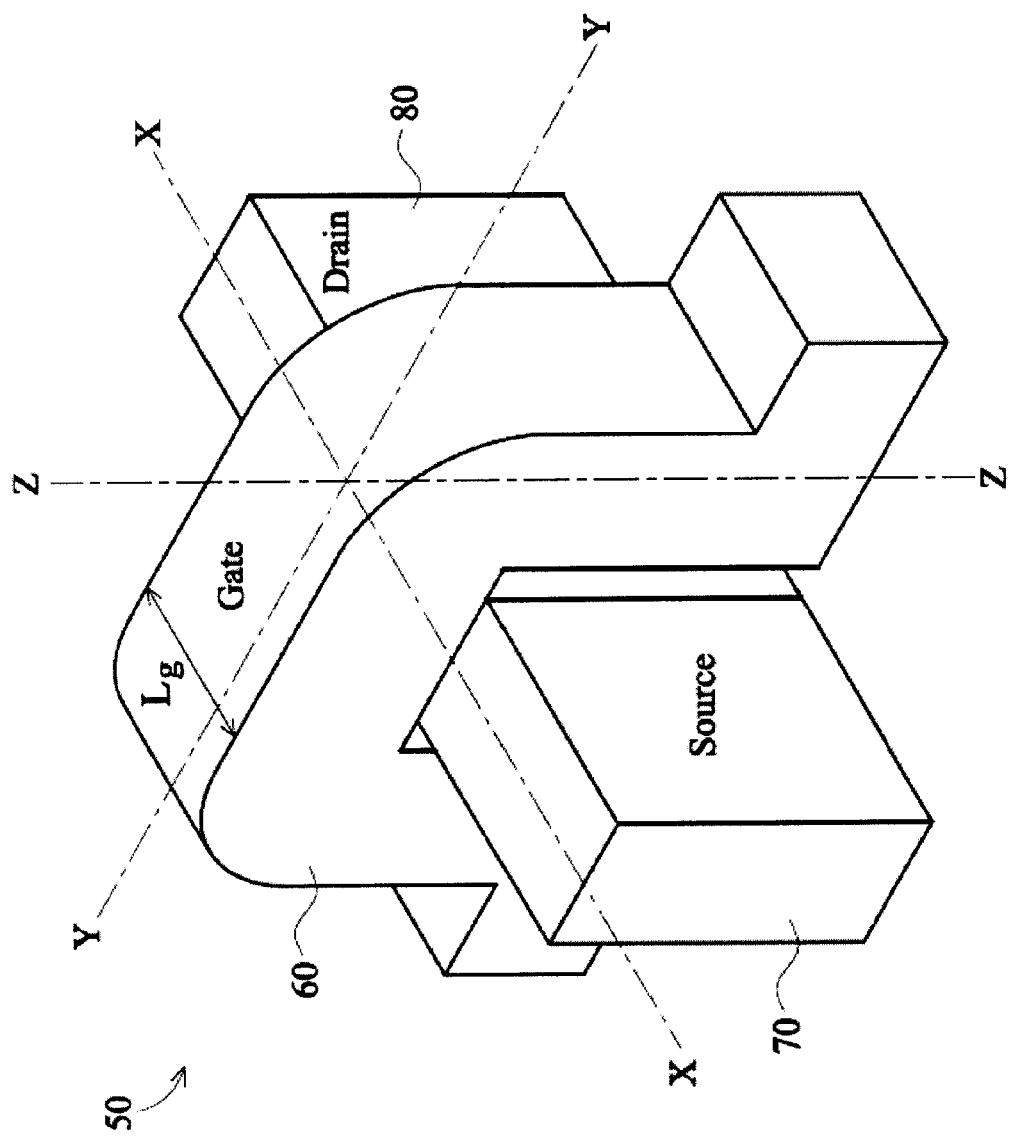
FIG. 1 is a simplified diagrammatic perspective view of an example FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of FinFET devices has been gaining popularity in the semiconductor industry. Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, traditional methods of FinFET fabrication typically involve an "STI-first" process flow formation. In the STI-first process flow, the STI (shallow trench isolation) devices are formed first, and then the channel (e.g., a SiGe channel) is formed thereafter. The STI-first process flow may lead to defects in the channel that are induced by the STI, a smaller epitaxial growth process window for the channel, as well as undesirable epi and etch loading effects. Traditional methods of fabricating FinFET devices may also employ a Silicon-on-Insulator (SOI) approach to provide better electrical isolation. However, conventional SOI processes may involve wafer bonding, which is an extra process step and may increase fabrication time, cost, and complexity. In addition, traditional FinFET devices may not have fin shapes or surfaces that are optimized for device performance.

To address the problems of the traditional FinFET devices and their methods of fabrication, the present disclosure utilizes a channel-first process to reduce STI-related defects and to achieve an SOI scheme without using wafer bonding. The present disclosure also forms fins with a [551] or [661] surface, which improves the performance of the FinFET devices. Furthermore, the various process steps of fabricating the FinFET devices according to the present disclosure will lead to a distinct fin shape, which includes a laterally-recessed fin bottom, as will be discussed in more detail later.

FIGS. 2-14 are simplified diagrammatic fragmentary cross-sectional side views of a semiconductor device 100 at various stages of fabrication. In the illustrated embodiment, the semiconductor device 100 is a FinFET device, which includes both a p-channel metal-oxide-semiconductor (PMOS) an n-channel metal-oxide-semiconductor (NMOS). The cross-sectional views of FIGS. 2-14 are taken across the Y-Z plane of FIG. 1. In other word, the lateral axis (or horizontal direction) in FIGS. 2-14 corresponds to the Y-axis, and the vertical axis (or vertical dimension) in FIGS. 2-14 corresponds to the Z axis.

Figure 2:
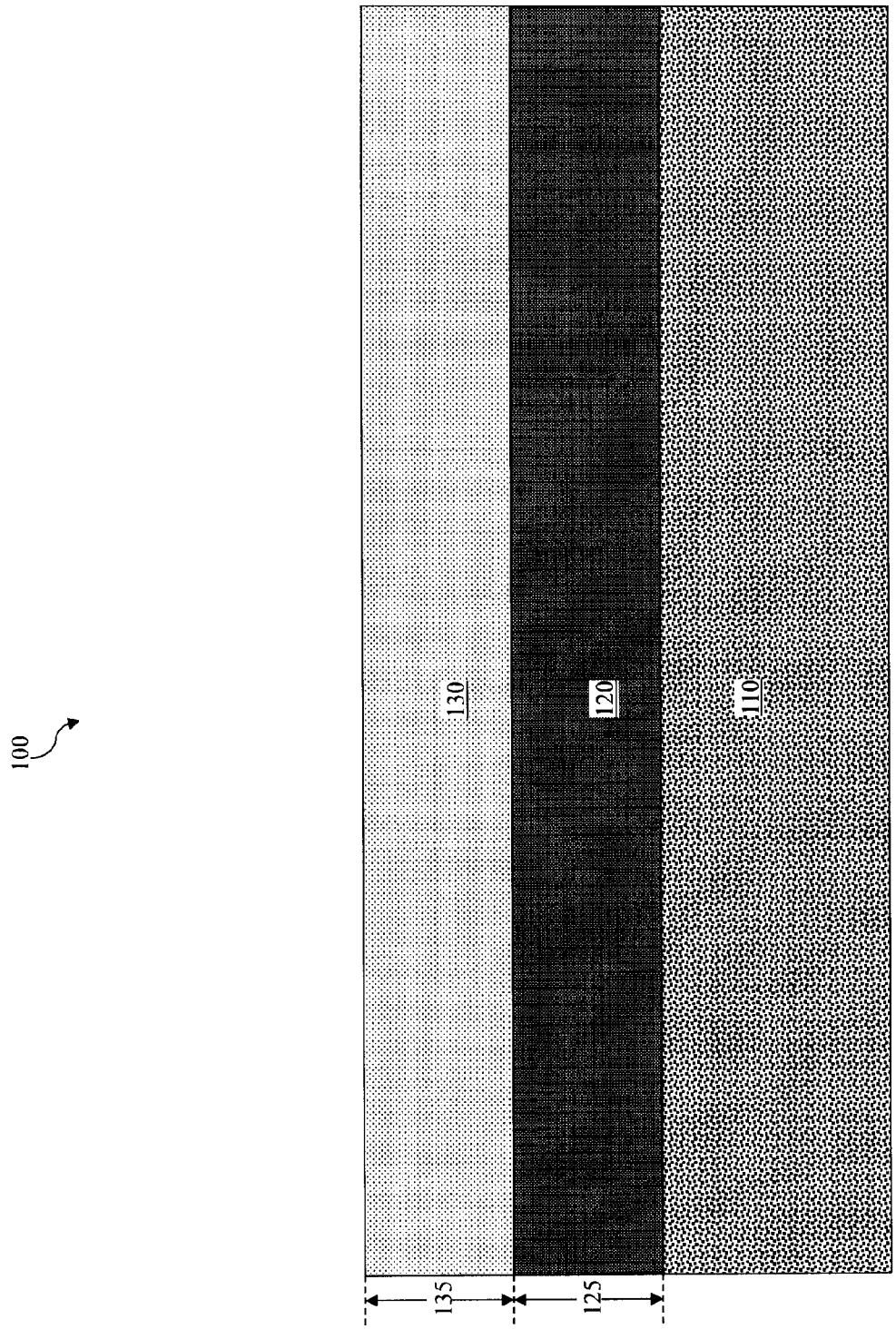
FIGS. 2-14 are simplified diagrammatic cross-sectional side views of a FinFET device at various stages of fabrication in accordance with some embodiments.

Referring now to FIG. 2, the semiconductor device 100 includes a substrate 110. In the illustrated embodiment, the substrate 110 is a silicon substrate, though it is understood that other types of substrates may also be used in alternative embodiments. A semiconductor layer 120 is formed over the substrate 110, for example through an epitaxial growth process. In the illustrated embodiment, the semiconductor layer 120 includes silicon germanium ($SiGe_x$), wherein x is in a range from about 20% to about 50%. The semiconductor layer 120 is formed to have a thickness (measured in the vertical or Z direction) 125. Another semiconductor layer 130 is formed over the semiconductor layer 120, for example through an epitaxial growth process. In the illustrated embodiment, the semiconductor layer 130 includes silicon. The semiconductor layer 130 is formed to have a thickness (measured in the vertical or Z direction) 135. In order to reduce defects (such as cross-hatch defects) and to provide appropriate strain (for example a tensile strain), the thicknesses 125 and 135 are controlled to not exceed a critical thickness. In some embodiments, the thickness 125 is in a range from about 20 nanometers (nm) to about 50 nm, and the thickness 135 is in a range from about 20 nm to about 60 nm. In some embodiments, the thickness 125 for the layer 120 is smaller than about 35 nm when the germanium content of the layer 120 is about 50%. The thickness 125 may increase as the germanium content decreases. For example, the thickness 125 may be about 100 nm if the layer 120 has about a 20% germanium content. In some embodiments, the thickness 125 of the layer 120 also depends on the thermal process in the epi-growth of the layer 130. The thickness 135 of the layer 130 also depends on the germanium content of the layer 120. If the layer 120 has a high germanium content, the layer 130 may be thinner, as a larger thickness will have a larger thermal impact to induce relaxation in the layer 120. The thickness 135 of the layer 130 may also be a function of the fin-height.

Figure 3:
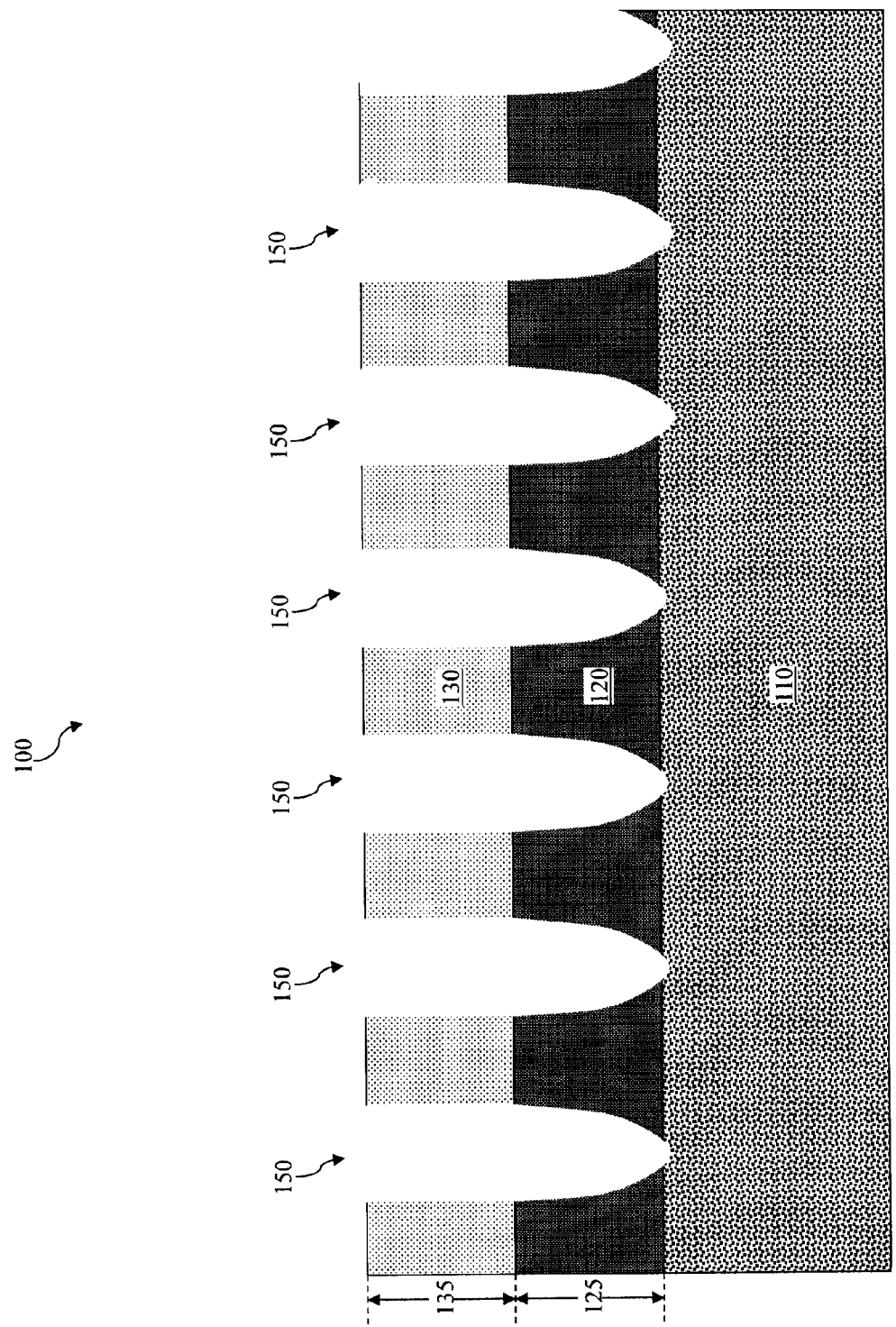

Referring now to FIG. 3, a plurality of recesses 150 is formed. The recesses 150 vertically extend through the semiconductor layers 130 and 120 and may partially extend into the substrate 110. In some embodiments, the recesses 150 may be formed by one or more etching processes. The recesses 150 are reserved for the deposition of shallow-trench-isolation (STI) devices in a later process.

Figure 4:
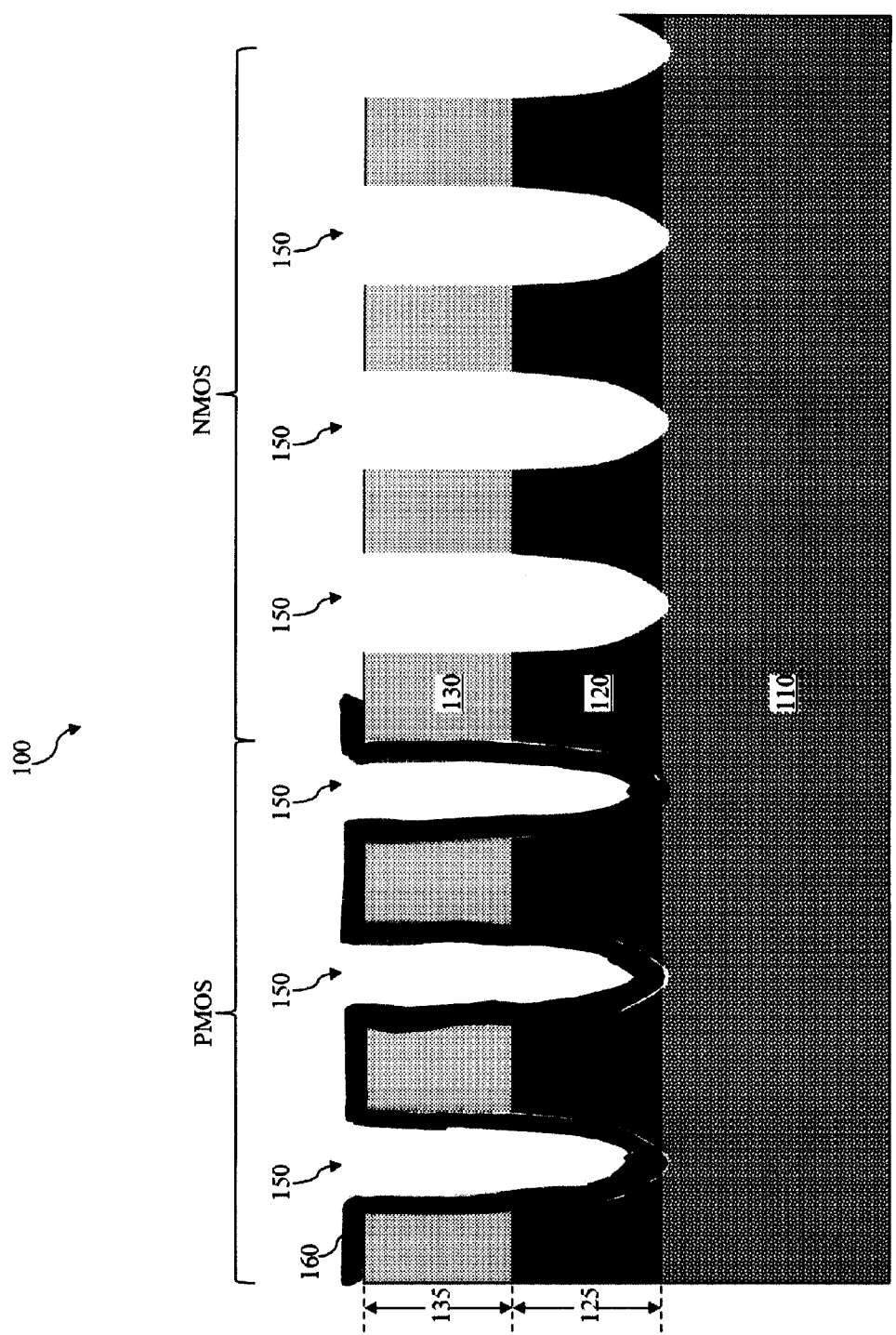

Referring now to FIG. 4, a dielectric layer 160 is formed. The dielectric layer 160 may be formed by one or more patterning (e.g., deposition and etching) processes in some embodiments, and may include any type of suitable dielectric material such as silicon oxide or silicon nitride. According to the present disclosure, the dielectric layer 160 is formed in a PMOS region of the semiconductor device 100, but not in an NMOS region of the semiconductor device 100. Thus, the dielectric layer 160 fills the recesses 150 in the PMOS region, but not the recesses 150 in the NMOS region. The dielectric layer 160 protects the semiconductor layers 130 and 120 in the PMOS region in a subsequent oxidation process. In other words, the dielectric layer 160 prevents the semiconductor layers 130 and 120 in the PMOS region from being oxidized in a later process.

Figure 5:
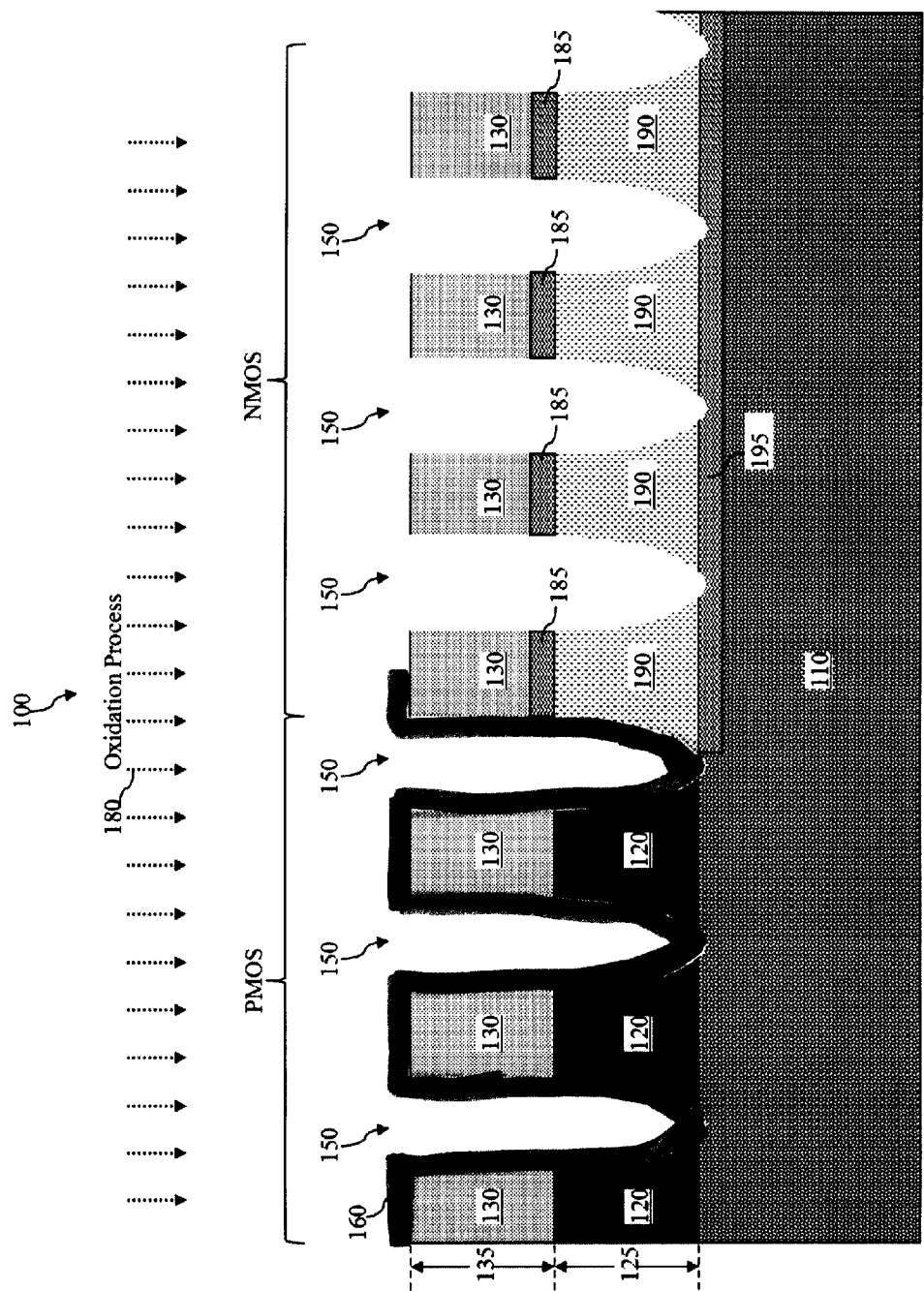

Referring now to FIG. 5, an oxidation process 180 is performed to the semiconductor device 100. In some embodiments, the oxidation process 180 is performed by exposing the semiconductor device 100 to an $Ar/N_2/H_2$ ambient at a process temperature of about 400 to 650 degrees Celsius and for several hours. The process temperature and duration may be dependent on the initial thickness 125 of the semiconductor layer 120.

The oxidation process 180 is performed until the semiconductor layer 120 in the NMOS region has become fully oxidized. The oxidation process 180 may also oxidize a portion of the semiconductor layer 130. Since silicon and silicon germanium have different oxidation rates (silicon germanium oxidizes at a faster rate than silicon), a small portion of the semiconductor layer 130 may be oxidized while the semiconductor layer 120 in the NMOS region is completely oxidized. For example, in the illustrated embodiment, the portion of the semiconductor layer 130 near the interface with the semiconductor layer 120 becomes oxidized, as well as a surface portion of the substrate 110.

As a result of the oxidation process 180, oxide segments 185, 190, and 195 are formed in the NMOS region of the semiconductor device 100, as illustrated in FIG. 5. Namely, the oxidation process 180 transforms a portion of the semiconductor layer 130 in the NMOS region into the oxide segments 185, transforms the semiconductor layer 120 in the NMOS region into the oxide segments 190, and transforms an interface between the substrate 110 and the semiconductor layer 120 into an oxide segment 195. In the illustrated embodiment, the oxide segments 185 and 195 contain silicon oxide, and the oxide segments 190 contain silicon germanium oxide.

These oxide segments 195, 190, and 185 collectively serve as an electrically insulating material similar to the insulator of the SOI approach. In other words, the semiconductor layer 130 in the NMOS region contains silicon in the illustrated embodiment, and it is now disposed on an insulator (formed collectively by the oxide segments 195, 190, and 185). As such, the present disclosure effectively provides an SOI-equivalent scheme without having to use wafer bonding. Also as discussed above, the dielectric layer 160 prevents the semiconductor layers 120 and 130 in the PMOS region from being oxidized in the oxidation process 180.

Figure 6:
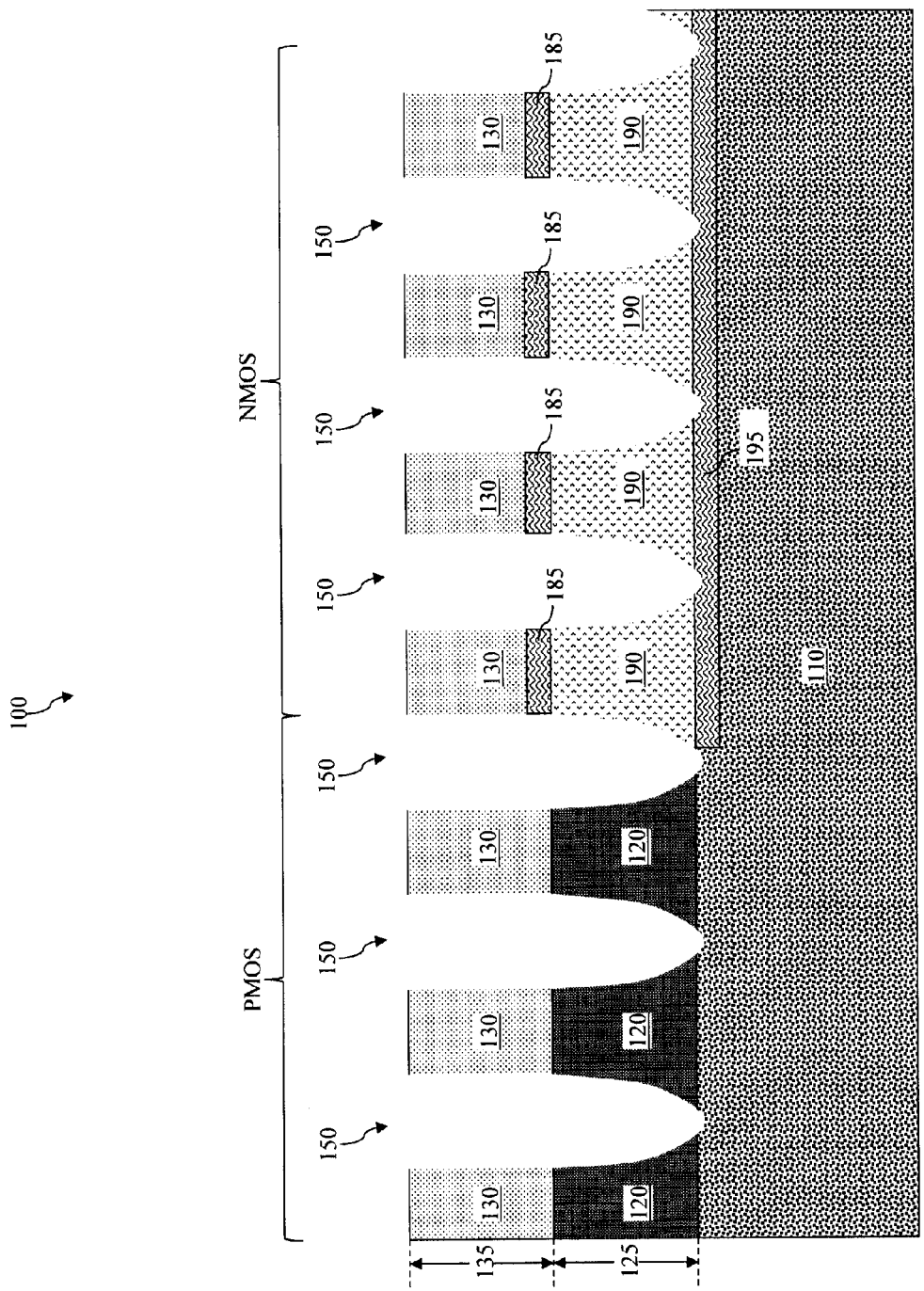

Referring now to FIG. 6, the dielectric layer 160 is removed, for example through one or more etching processes. At this stage of fabrication, the recesses 150 in both the PMOS region and the recesses 150 in the NMOS region of the semiconductor device 100 are exposed.

Figure 7:
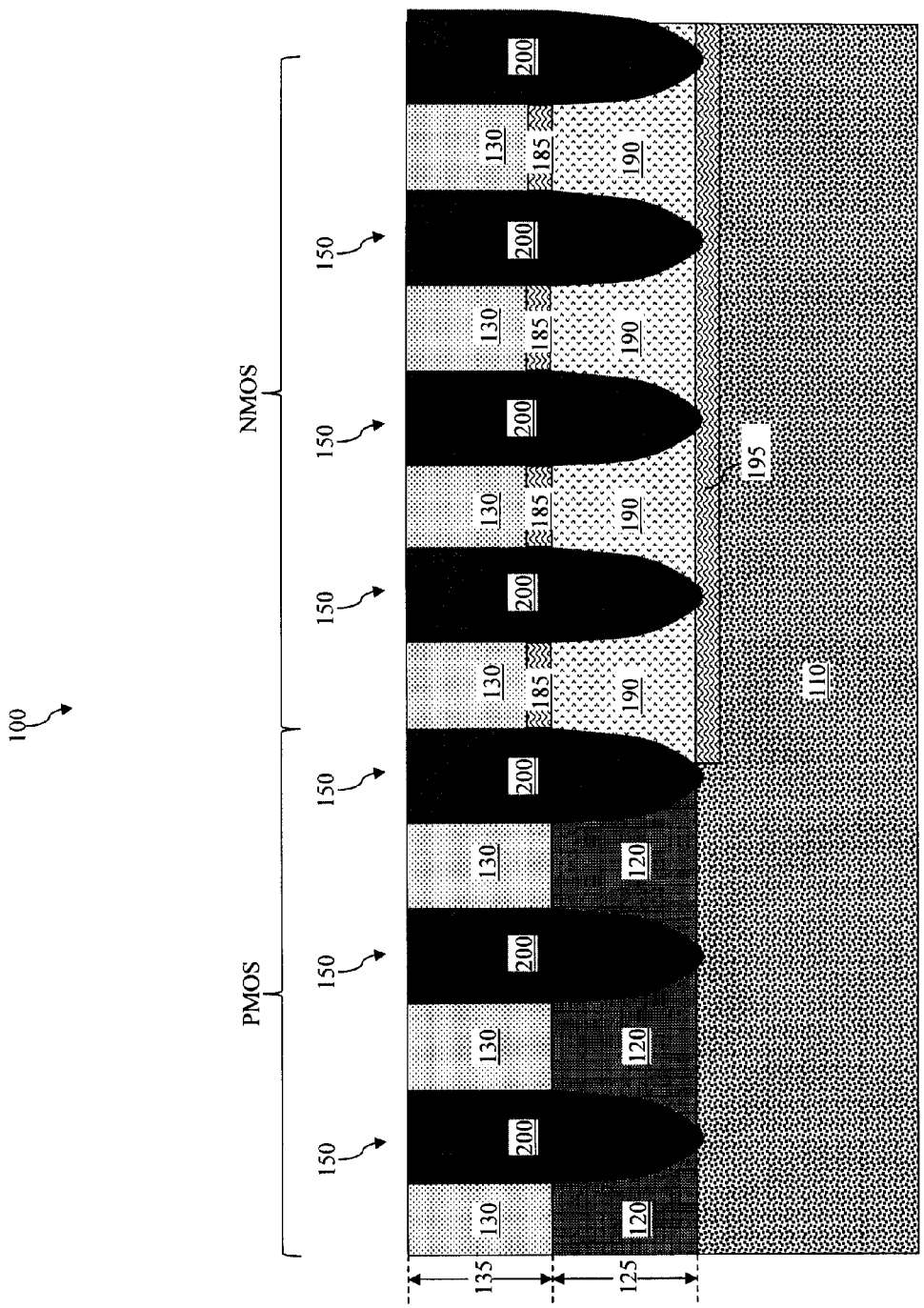

Referring now to FIG. 7, a plurality of STI devices 200 are formed in the recesses 150 in both the PMOS and NMOS regions. The STI devices 200 may be formed by a deposition process (depositing a dielectric material in the recesses) followed by a polishing process (e.g., chemical mechanical polishing, also referred to as CMP) to remove excess dielectric material outside the recesses 150 and to planarize the surface of the STI devices 200.

Traditional methods of fabricating FinFETs may employ an STI-first approach, in which the STI devices are formed before the channel. As discussed above, the STI-first process flow may lead to problems such as defects in the channel (induced by the STI), a smaller epitaxial growth process window for the channel, as well as undesirable epi and etch loading effects. In comparison, the present disclosure employs a channel-first approach, in which the STI devices 200 are formed after the channel (e.g., the semiconductor layer 130) is formed. By doing so, the semiconductor device 100 is substantially free of STI-induced defects. In addition, the formation of STI devices 200 after the formation of the channels also allows the semiconductor device 100 to enjoy a larger epitaxial process window. Furthermore, the channel-first approach substantially eliminates the epi and etch loading effects typically associated with the STI-first approach.

Figure 8:
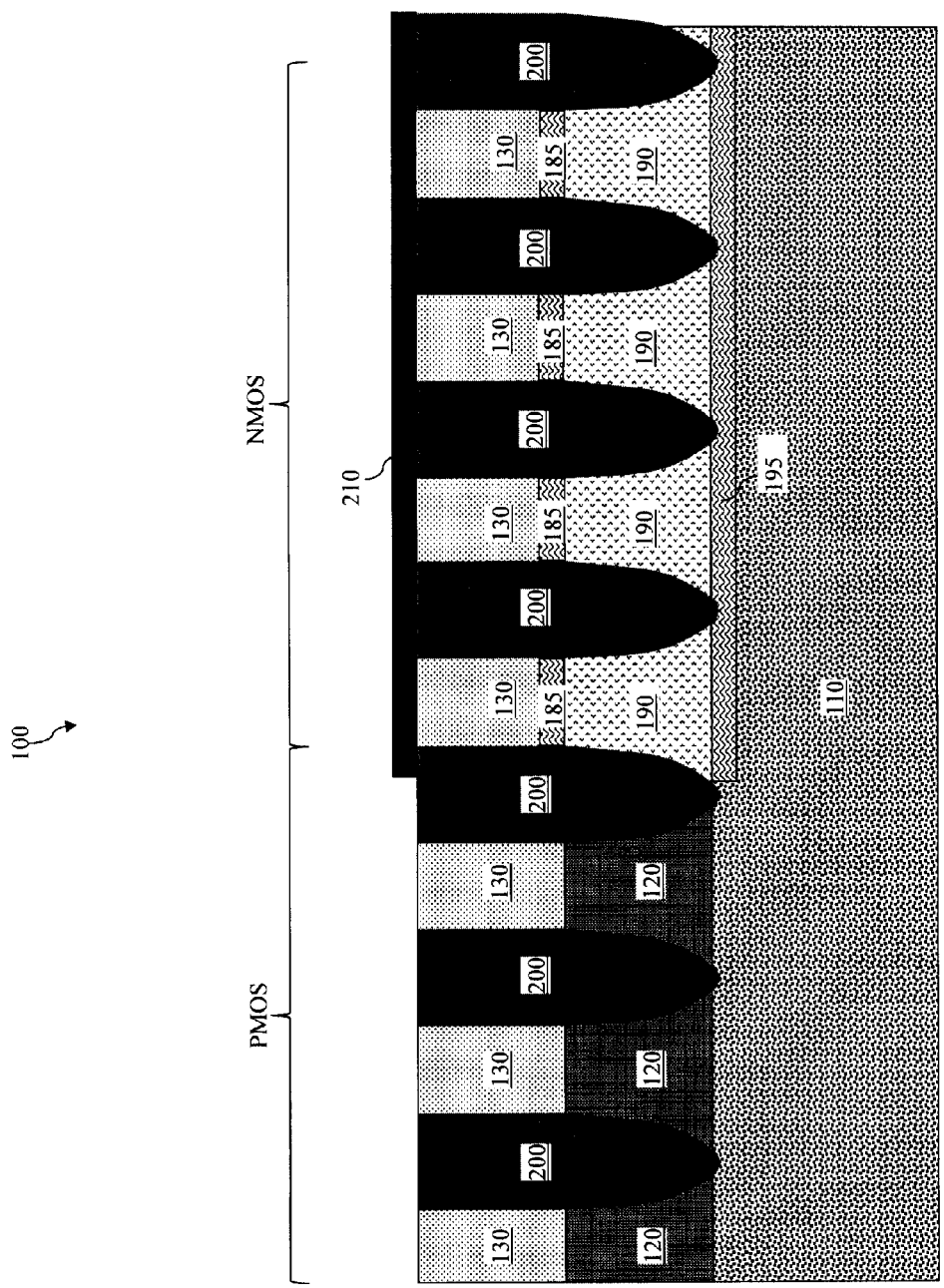

Referring now to FIG. 8, a dielectric layer 210 is formed over the semiconductor layer 130 (and over the STI devices 200) in the NMOS region. The dielectric layer 210 may be formed by one or more deposition and patterning processes. In various embodiments, the dielectric layer 210 may contain silicon oxide or silicon nitride. The dielectric layer 210 protects the semiconductor layer 130 in the NMOS region from being removed in a subsequent process discussed below with reference to FIG. 9.

Figure 9:
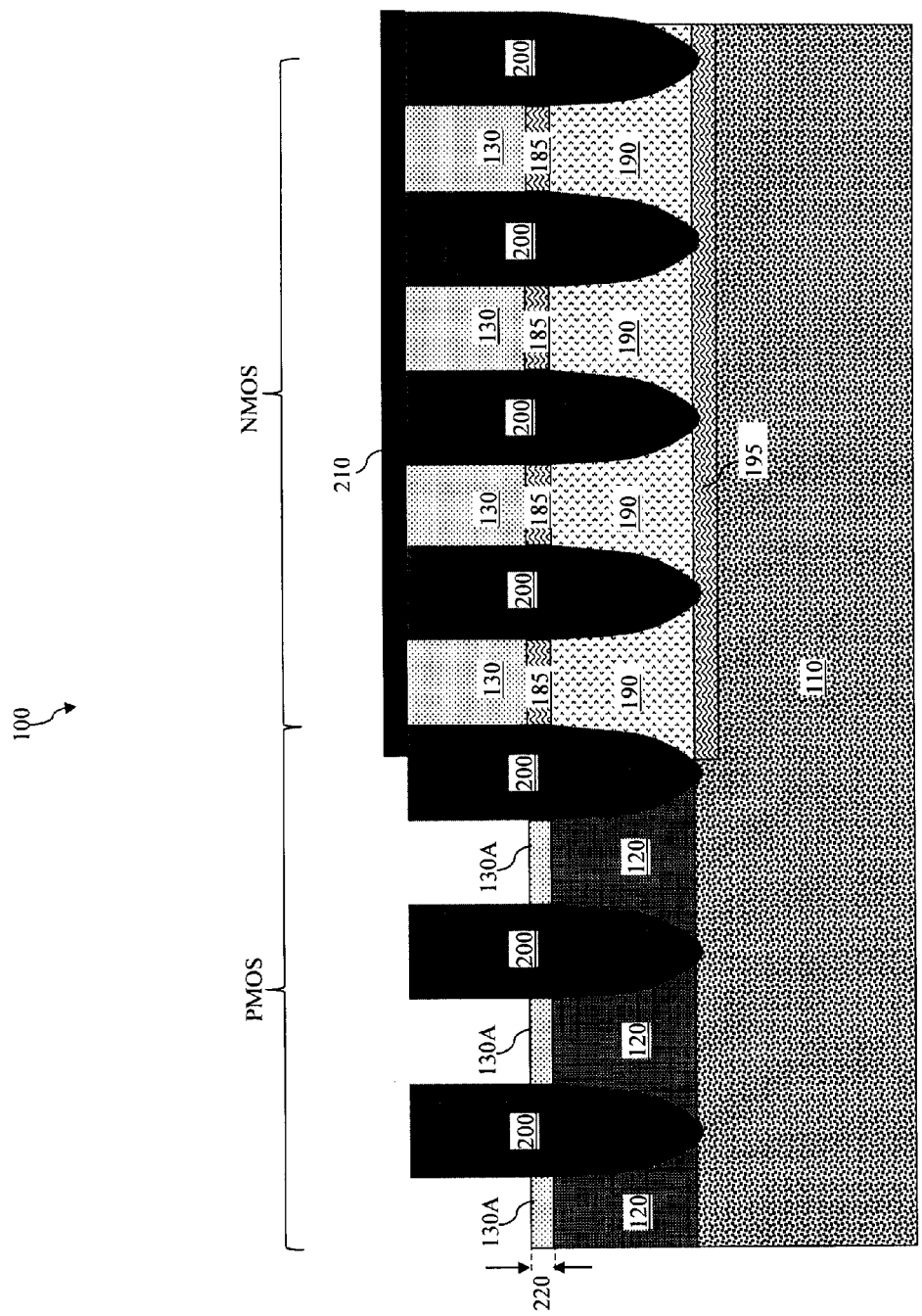

Referring now to FIG. 9, the semiconductor layer 130 in the PMOS region is partially removed, for example by an etching process. The etching process is configured in a manner such that there is a high etching selectivity between the semiconductor layer 130 and the dielectric layer 210. Thus, the dielectric layer 210 is not removed (at least not substantially) while the semiconductor layer 130 in the PMOS region is removed. As discussed above, since the dielectric layer 210 is formed over and protects the semiconductor layer 130 in the NMOS region, the semiconductor layer 130 in the NMOS region are also not affected (i.e., removed) as the semiconductor layer 130 in the PMOS region is removed.

Note that according to the various aspects of the present disclosure, the semiconductor layer 130 in the PMOS region is not removed completely. Instead, the removal process is configured to stop so that a small portion of the semiconductor layer 130 is preserved. This remaining portion of the semiconductor layer 130 is hereinafter designated as the semiconductor layer 130A. The semiconductor layer 130A has a thickness 220. In some embodiments, the thickness 220 is in a range from about 20 angstroms to about 300 angstroms. One reason for the preservation of the semiconductor layer 130A is to improve the quality of a semiconductor layer to be grown in the PMOS region in a subsequent process, as discussed below.

Figure 10:
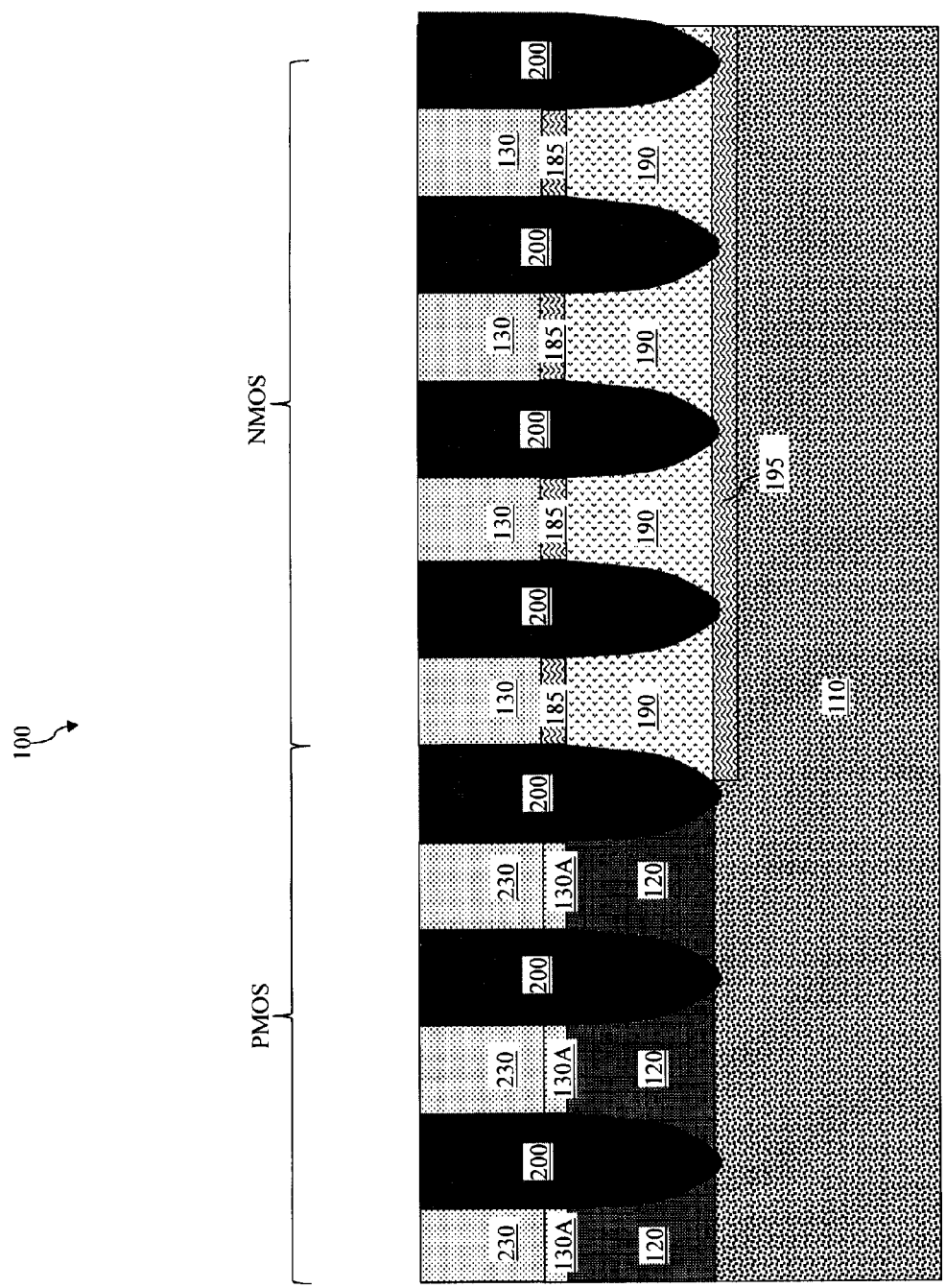

Referring now to FIG. 10, a semiconductor layer 230 is formed over the semiconductor layer 130A in the PMOS region. In some embodiments, the semiconductor layer 230 includes silicon germanium. The semiconductor layer 230 may be formed in an epitaxial deposition process. The presence of the semiconductor layer 130A allows the semiconductor layer 230 to be grown with a high crystal quality that is substantially free of defects. For example, the layer semiconductor 120 is grown to be fully strained to the silicon substrate, so that lattice constant of the layer 120 should be coherent to silicon. With the thickness control (in this case, the SiGe material is only grown in a small area, the critical thickness should be large enough), the SiGe material of the semiconductor layer 230 should be grown with strain and without relaxation. One reason for growing the SiGe material of the semiconductor layer 230 on the silicon material of the layer 130A is that it may be easier to control the surface of the etched silicon suitable for epitaxy, whereas the surface of etched SiGe is not good for subsequent SiGe epi-growth.

A polishing process, such as a CMP process, may then be performed to remove excess portions of the semiconductor layer 230 (e.g., portions taller the STI devices 200) and to achieve a planarized upper surface. The dielectric layer 210 (shown in FIG. 9) is also removed by the polishing process.

Figure 11:
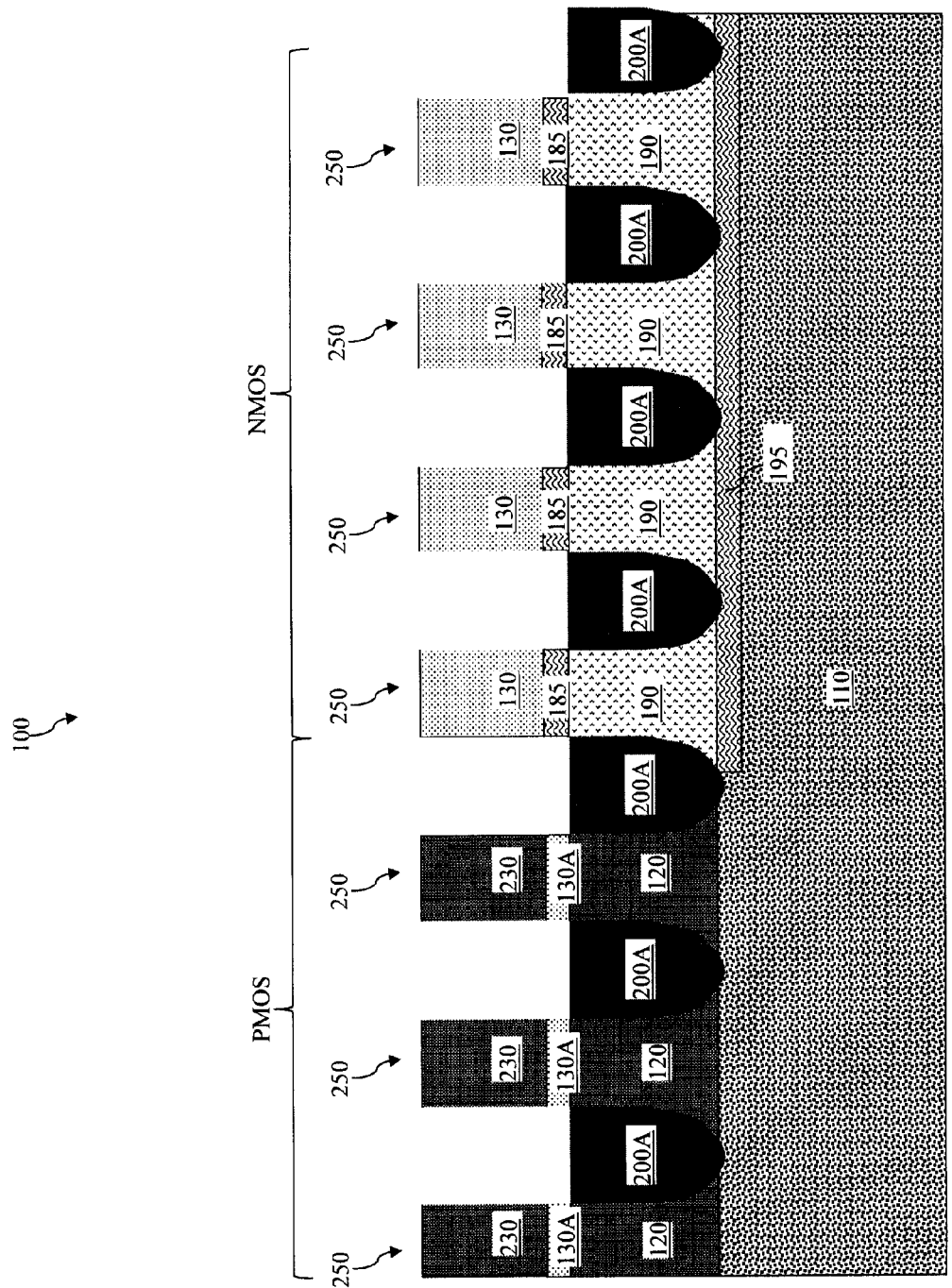

Referring now to FIG. 11, a portion of each of the STI devices 200 is removed so as to laterally expose the semiconductor layers 230 and 130 (as well as the semiconductor layer 130A in the PMOS region and the oxide segments 185 in the NMOS region). A remaining portion 200A of each STI device is still disposed on side surfaces of the semiconductor layer 120 and the oxide segments 190 after the STI removal process.

The exposed portions of the semiconductor layers 230 and the semiconductor layer 130A may be referred to as fins 250 of a PMOS of a FinFET device (i.e., the semiconductor device 100), and the exposed portions of the semiconductor layer 130 may be referred to as fins 250 of an NMOS of the FinFET device. As such, the STI removal process illustrated in FIG. 11 may also be referred to as a fin-exposure process.

It is understood that the oxide segments 185 disposed underneath the semiconductor layer 130 in the NMOS region may also be considered a part of the fins 250 for the NMOS. However, since the oxide segments 185 are not electrically conductive, they cannot be part of the channel (nor source or drain) of the NMOS.

Figure 12:
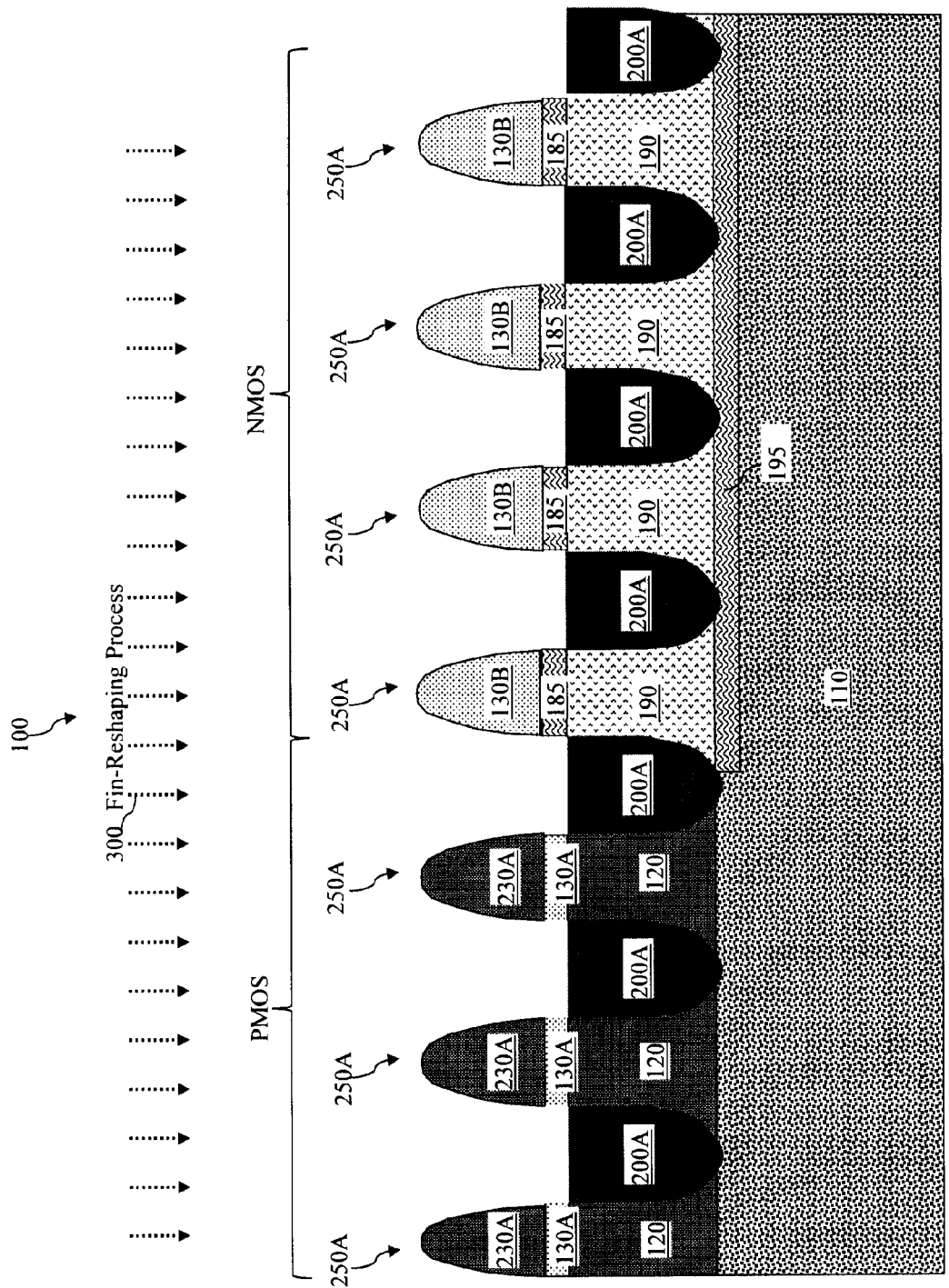

Referring now to FIG. 12, a fin-reshaping process 300 is performed to the semiconductor device 100 to reshape the fins 250 into fins 250A. In more detail, the semiconductor layer 230 in the PMOS region is reshaped into a semiconductor layer 230A, and the semiconductor layer 130 in the NMOS region is reshaped into a semiconductor layer 130B. As illustrated, the reshaped semiconductor layers 230A and 130B have more curved profiles, as opposed to the more rectangular profiles for the semiconductor layers 230 and 130 as shown in FIG. 11 prior to being reshaped. The top portions of the reshaped semiconductor layers 230A and 130B are narrower than the bottom portions.

The fin-reshaping process 300 is performed to improve device performance. In some embodiments, the fin-reshaping process 300 is performed in a manner such that the reshaped semiconductor layers 230A and 130B each have a [551] or a [661] surface. One benefit of the [551] or [651] surfaces is that they lead to smoother surfaces that can be more easily maintained for various environments. The smoother surfaces also improve epitaxial growth. Another benefit of the [551] or [661] surfaces is that they improve the electrical current drivability or deliverability of the semiconductor device 100, which may be a result of an enhanced current drivability or carrier mobility for the PMOS. In other words, the improved current drivability of the PMOS makes it approach the current drivability of the NMOS, so that they become more equal. This balanced current drivability of PMOS and NMOS is desirable especially for CMOS applications.

In some embodiments, the fin-reshaping process 300 includes a wet etching process, in which $NH_4OH$, Ammonia-peroxide mixture (APM, or $NH_4OH+H_2O_2$), tetramethylammonium hydroxide (TMAH), HPM ($HCl+NH_4OH$) may be used as etchants. In some embodiments, these etchants are used to etch the Fins for fin-reshaping according to a sequence for the purpose of handling the SiGe and Si Fins' surface roughness. The etchant may be applied in either a wet dipping process or a spin-coating type of process. The fin-reshaping process 300 is also performed at a temperature in a range from about room temperature (e.g., 25 degrees Celsius) to about 70 degrees Celsius.

Figure 13:
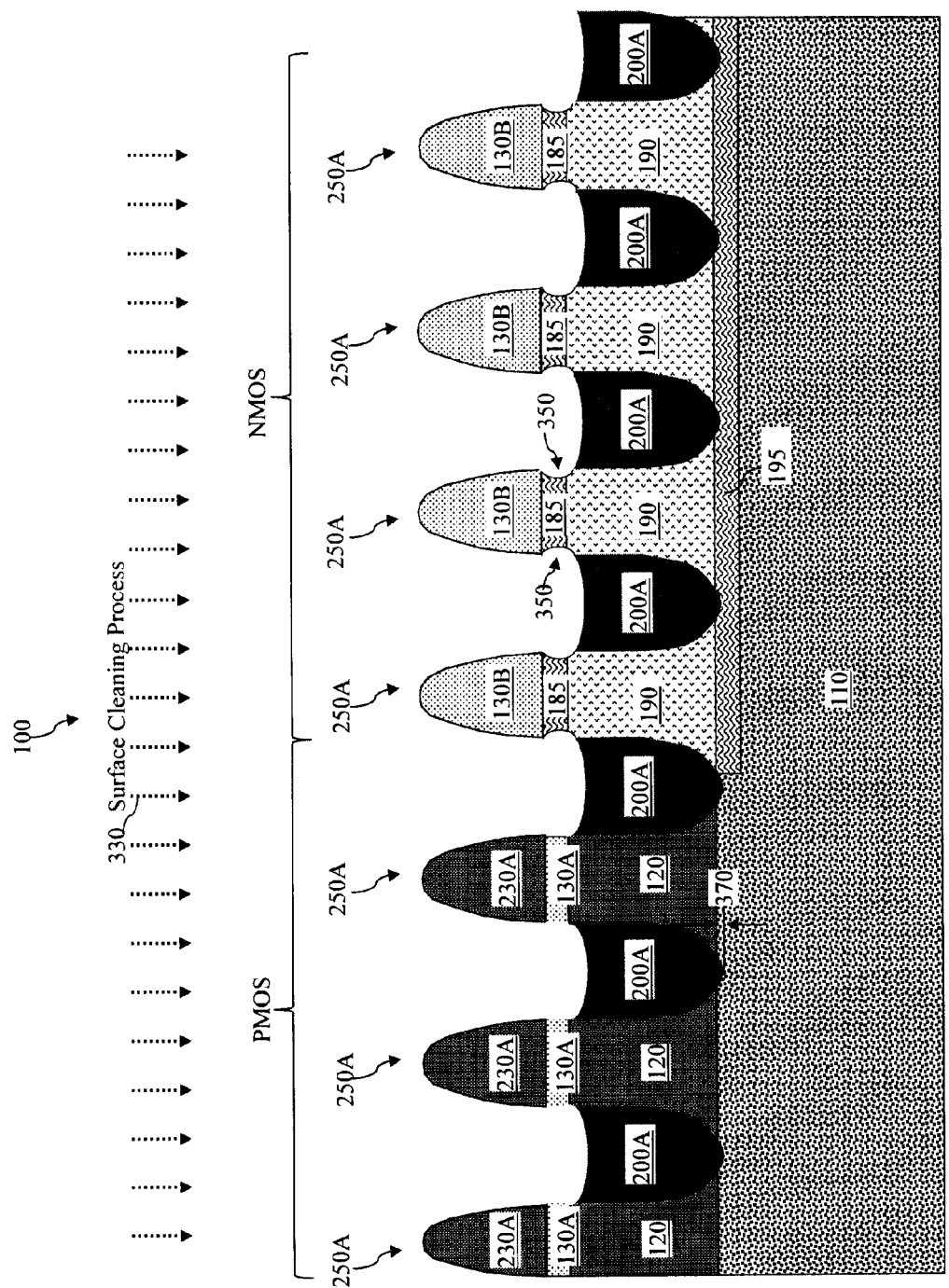

Referring now to FIG. 13, a cleaning process 330 is performed to the semiconductor device 100 to prepare itself for the formation of gate stacks in a later process. In more detail, to ensure good quality of the gate stacks, native oxide formed on the surfaces of the fins should be removed. The cleaning process 330 is configured to remove such native oxide. In some embodiments, the cleaning process 330 includes applying diluted hydrofluoric acid (HF) to the surfaces of the semiconductor device 100 for about several tens of seconds. The diluted HF may have a concentration in a range from about 50:1 to about 500:1 (i.e., a ratio of water to HF is in a range from about 50:1 to about 500:1). The cleaning process 330 also includes using a SiCoNi:NF$_3$/NH$_3$ plasma with a Ar/He/H$_2$ carrier at a temperature between about 28 degrees Celsius to about 130 degrees Celsius to remove the native oxide formed on the semiconductor device 100. In some embodiments, the HF and the SiCoNi are used in two distinct process steps. HF is used in the first step to remove a majority part of the native oxide. Thereafter, the wafers will be sent into an epi-chamber with Q-time control. In the epi-chamber, the SiCoNi is used in the second step to clean the surface again to facilitate the epitaxy process in-situ.

As discussed above, there are oxide segments 185 (e.g., silicon oxide) at the bottom portions of the fins 250A in the NMOS region. Alternatively stated, the fins 250A in the NMOS region are sitting on top of oxide segments 185. Since the cleaning process 330 removes oxides, it also causes some portions of these oxide segments 185 to be removed. Furthermore, some portions of the oxide segments 190 (e.g., silicon germanium oxide) underneath the oxide segments 185 may also end up being removed by the cleaning process 330. The partial removal of the oxide segments 185 and 190 (by the cleaning process 330) creates laterally concaved recesses 350 at the bottom of the fins 250A in the NMOS region. These recesses 350 are one of the unique physical characteristics of the embodiments of the present disclosure, as they do not appear in FinFETs fabricated under traditional processes.

The fins 250A in the PMOS region are disposed over the semiconductor layer 130A, rather than oxides. Consequently, the cleaning process 330 does not cause any recesses to be formed in the fins 250A in the PMOS region. Thus, the NMOS fins and the PMOS fins are now shaped differently or have different geometries.

Note that in embodiments where the STI devices 200A include oxide, such as the illustrated embodiment, the cleaning process 330 may also cause portions of the STI devices 200A to be removed. The remaining STI devices 200A therefore exhibit a dishing-like profile. Furthermore, as shown in FIG. 13, the STI devices 200A are formed to extend vertically into the substrate 110 (i.e., below the semiconductor layer 120). A lowest point of the STI device 200A is at a distance 370 below the bottom surface of the semiconductor layer 120. In some embodiments, the distance 370 is less than about 2 nm.

Figure 14:
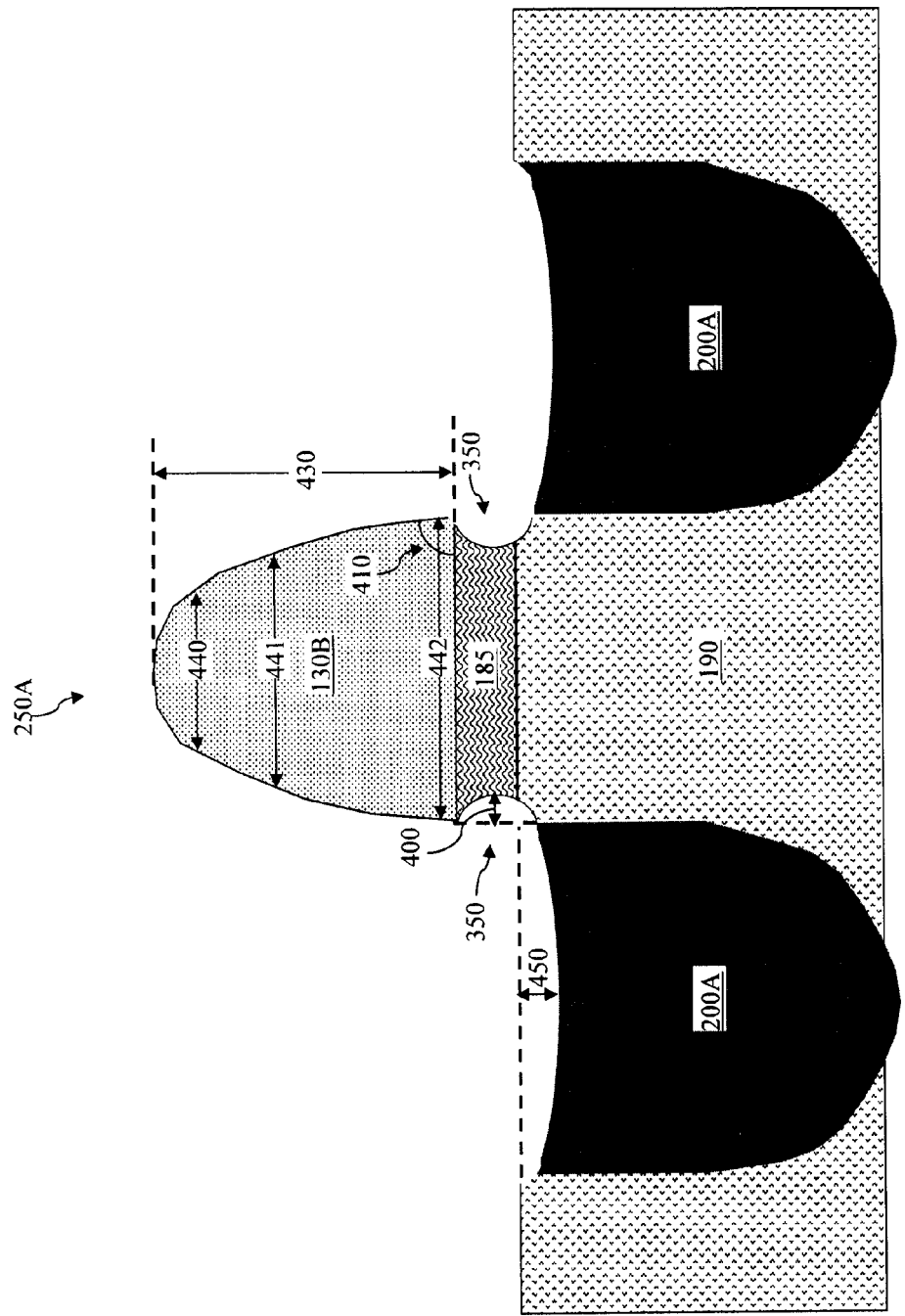

FIG. 14 is a more detailed cross-sectional view of one of the fins 250A in the NMOS region. As illustrated, the recesses 350 each extend laterally into the oxide segment 185 by a horizontal distance 400. In some embodiments, the distance 400 is in a range from about 2 nm to about 15 nm. The side surface of the fin 250A (i.e., of the semiconductor layer 130B) forms an angle 410 with the bottom surface of the semiconductor layer 130B (or with the top surface of the oxide segment 185). In some embodiments, the angle 410 is in a range from about 80 degrees to about 85 degrees. The fin 250A also has a channel height 430, which in the illustrated embodiment is defined as a distance from the top of the semiconductor layer 130B to a bottom surface of the semiconductor layer 130B. In some embodiments, the channel height 430 is in a range from about 32 nm to about 34 nm.

As discussed above, the reshaped fin 250A has a profile such that it is narrower at the top but wider at the bottom. For example, at a depth (measure from the top of the fin) of about 5 nm, the fin 250A has a lateral dimension (or width) 440 that is in a range from about 3.6 nm to about 4.4 nm. At a depth of about 15 nm, the fin 250A has a lateral dimension (or width) 441 that is in a range from about 5.4 nm to about 6.6 nm. At a depth of about 30 nm, the fin 250A has a lateral dimension (or width) 442 that is in a range from about 9 nm to about 11 nm.

Also as discussed above, the STI devices 200A exhibit dishing-like profiles. For example, the STI device 200A is recessed vertically downward at a distance 450. In some embodiments, the distance 450 is greater than about 5 nm, for example in a range from about 12 nm to about 14 nm.

Figure 15:
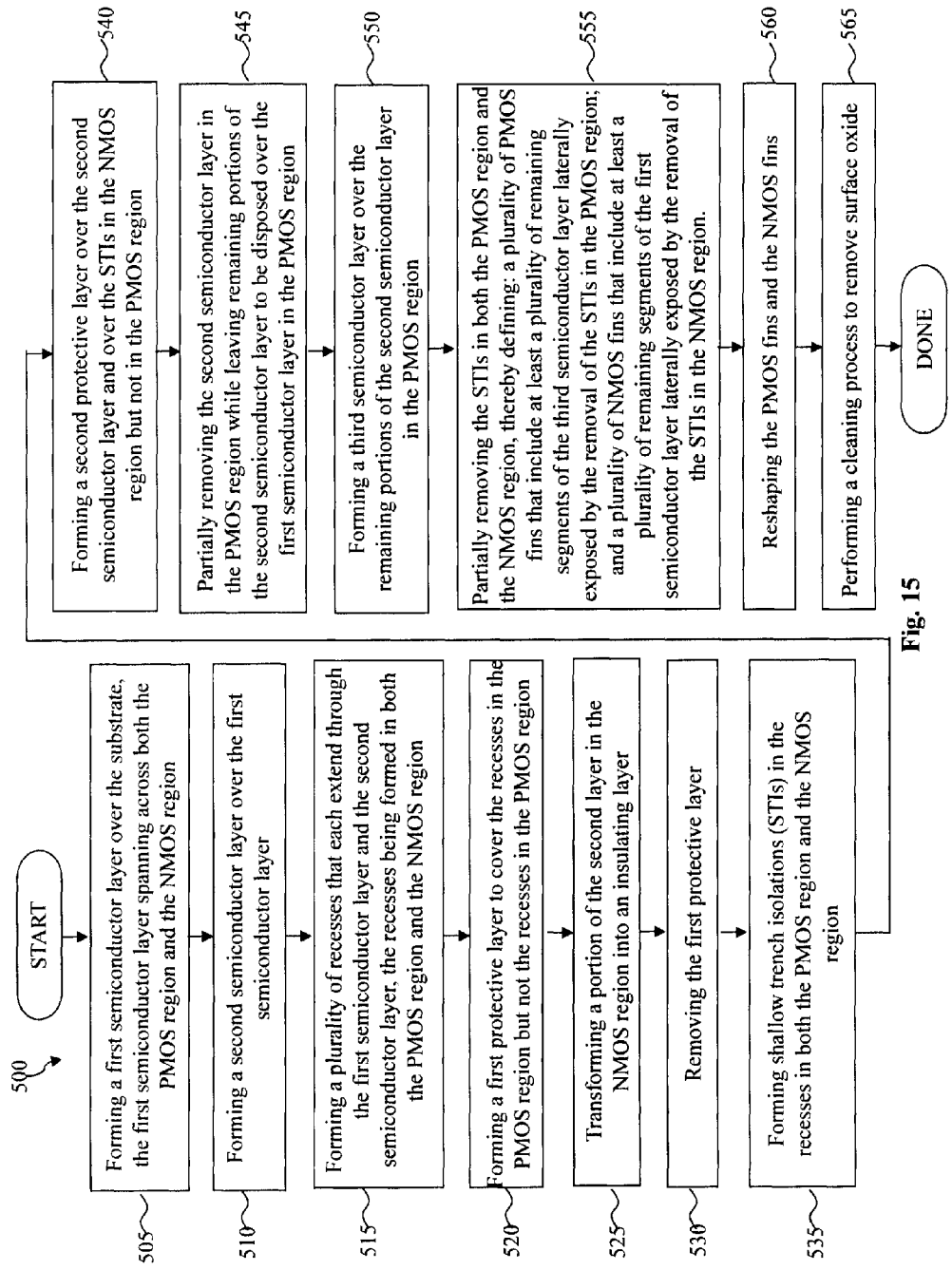
FIG. 15 is a flowchart illustrating a method of fabricating a FinFET device in accordance with some embodiments.

FIG. 15 is a flowchart of a method 500 for fabricating a semiconductor device, for example a FinFET device, in accordance with various aspects of the present disclosure. The semiconductor device includes a PMOS region and an NMOS region. The method 500 includes a step 505 of forming a first semiconductor layer over the substrate. The first semiconductor layer spans across both the PMOS region and the NMOS region. In some embodiments, the substrate is a silicon substrate, and the step 505 of forming the first semiconductor layer includes epi-growing a silicon germanium as the first semiconductor layer over the silicon substrate.

The method 500 includes a step 510 of forming a second semiconductor layer over the first semiconductor layer. In some embodiments, the step 510 of forming the second semiconductor layer includes epi-growing silicon as the second semiconductor layer over the silicon germanium (i.e., the first semiconductor layer).

The method 500 includes a step 515 of forming a plurality of recesses that each extend through the first semiconductor layer and the second semiconductor layer. The recesses are formed in both the PMOS region and the NMOS region.

The method 500 includes a step 520 of forming a first protective layer to cover the recesses in the PMOS region but not the recesses in the PMOS region.

The method 500 includes a step 525 of transforming a portion of the second semiconductor layer in the NMOS region into an insulating layer. In some embodiments, the transforming step 525 includes performing an oxidation process to transform silicon germanium of the first semiconductor layer into silicon germanium oxide. In some embodiments, the oxidation process transforms a portion of the silicon in the second semiconductor layer into silicon oxide.

The method 500 includes a step 530 of removing the first protective layer.

The method 500 includes a step 535 of forming shallow trench isolations (STIs) in the recesses in both the PMOS region and the NMOS region.

The method 500 includes a step 540 of forming a second protective layer over the second semiconductor layer and over the STIs in the NMOS region but not in the PMOS region.

The method 500 includes a step 545 of partially removing the second semiconductor layer in the PMOS region while leaving remaining portions of the second semiconductor layer to be disposed over the first semiconductor layer in the PMOS region.

The method 500 includes a step 550 of forming a third semiconductor layer over the remaining portions of the second semiconductor layer in the PMOS region. In some embodiments, the step 550 of forming of the third semiconductor layer comprises epi-growing silicon germanium as the third semiconductor layer over the remaining portions of the second semiconductor layer in the PMOS region.

The method 500 includes a step 555 of partially removing the STIs in both the PMOS region and the NMOS region, thereby defining: a plurality of PMOS fins and a plurality of NMOS fin. The PMOS fins include at least a plurality of remaining segments of the third semiconductor layer laterally exposed by the removal of the STIs in the PMOS region. The NMOS fins include at least a plurality of remaining segments of the first semiconductor layer laterally exposed by the removal of the STIs in the NMOS region.

The method 500 includes a step 560 of reshaping the PMOS fins and the NMOS fins. In some embodiments, the reshaping step 560 is performed such that the PMOS fins are shaped differently from the NMOS fins. In some embodiments, the reshaping is performed such that the PMOS fins and NMOS fins include [551] or [661] surfaces.

The method 500 includes a step 565 of performing a cleaning process to the semiconductor device. In some embodiments, the cleaning process is performed to remove native oxide on the surfaces of the fins. As a result of the cleaning process, the PMOS fins and the NMOS fins have different geometries. For example, the bottom portions of the NMOS fins are laterally recessed inward, but not the PMOS fins.

It is understood that additional process steps may be performed before, during, or after the steps 505-565 discussed above to complete the fabrication of the semiconductor device. For example, a step of forming gate structures may be performed after the cleaning process 565 is performed. For example, the gate structures may be similar to the gate 60 shown in FIG. 1 and thus can be formed to wrap around a portion of both the PMOS fin and the NMOS fin in a manner similar to that is shown in FIG. 1. Other process steps are not discussed herein for reasons of simplicity.

The embodiments of the present disclosure offer advantages over existing art, though it is understood that other embodiments may offer different advantages, not all advantages are necessarily discussed herein, and that no particular advantage is required for all embodiments. One of the advantages is associated with the channel-first approach of fabricating the FinFET. For example, the STI devices 200 are formed after the channel (e.g., the semiconductor layer 130) is formed. The channel-first approach eliminates STI-induced defects that have been traditionally associated with FinFET devices fabricated under the STI-first approach. In addition, the channel-first approach discussed herein also enhances the epitaxy process window and reduces undesirable etching and loading effects associated with FinFET devices fabricated under the STI-first approach.

Another advantage is that the present disclosure effectively achieves an SOI scheme without having to use wafer bonding. For example, as discussed above, the silicon and silicon oxide layers (in the NMOS region) may be oxidized to transform themselves into silicon oxide and silicon germanium oxide, which are dielectric insulators. The channel layer (e.g., silicon for NMOS) is disposed over these dielectric insulators. This type of SOI formation is easy to integrate into existing process flow, and whatever additional process times and costs incurred are negligible.

Yet another advantage is the better crystal quality growth. As discussed above, when the silicon material in the PMOS region is removed, a layer thereof is still preserved. In other words, the silicon removal is intended to be incomplete. The remaining silicon layer allows the future silicon germanium to be formed thereon to have reduced defects, therefore ensuring a better quality channel.

One more advantage is the fin reshaping process to create the [551] or [661] surfaces for the channel portions of the fins. The [551] or [661] surfaces improve the current drivability of the FinFET, in particular the PMOS. As a result, device performance is improved, for example due to better balancing between the PMOS and the NMOS.

Some embodiments of the present disclosure involve a semiconductor device. The semiconductor device may include a FinFET device. The semiconductor device includes a substrate. A dielectric layer is disposed over the substrate. A fin structure is disposed over the dielectric layer. The fin structure contains a semiconductor material. The dielectric layer disposed below the fin structure includes a lateral recess.

Some embodiments of the present disclosure involve a PMOS FinFET and an NMOS FinFET. The PMOS FinFET includes a substrate, a silicon germanium layer disposed over the substrate, and a silicon layer disposed over the silicon germanium layer. The PMOS FinFET also includes a PMOS fin disposed over the silicon layer. The PMOS fin contains silicon germanium. The NMOS FinFET includes the substrate, a silicon germanium oxide layer disposed over the substrate, and a silicon oxide layer disposed over the silicon germanium oxide layer. The NMOS FinFET also includes an NMOS fin disposed over the silicon oxide layer. The NMOS fin contains silicon. The silicon germanium oxide layer and the silicon oxide layer collectively define a concave recess in a horizontal direction. The concave recess is partially disposed below the NMOS fin.

Some embodiments of the present disclosure involve a method of fabricating a semiconductor device having a PMOS region and an NMOS region. A first semiconductor layer is formed over the substrate. The first semiconductor layer spans across both the PMOS region and the NMOS region. A second semiconductor layer is formed over the first semiconductor layer. A plurality of recesses is formed such that they each extend through the first semiconductor layer and the second semiconductor layer. The recesses are formed in both the PMOS region and the NMOS region. A first protective layer is formed to cover the recesses in the PMOS region but not the recesses in the PMOS region. A portion of the second semiconductor layer in the NMOS region is transformed into an insulating layer. Thereafter, the first protective layer is removed. Thereafter, shallow trench isolations (STIs) are formed in the recesses in both the PMOS region and the NMOS region. A second protective layer is then formed over the second semiconductor layer and over the STIs in the NMOS region but not in the PMOS region. The second semiconductor layer in the PMOS region is then partially removed while leaving remaining portions of the second semiconductor layer to be disposed over the first semiconductor layer in the PMOS region. A third layer is formed over the remaining portions of the second semiconductor layer in the PMOS region. The STIs in both the PMOS region and the NMOS region are then partially removed. The removal of the STIs defines a plurality of PMOS fins and a plurality of NMOS fins. The PMOS fins include at least a plurality of remaining segments of the third layer laterally exposed by the removal of the STIs in the PMOS region. The NMOS fins include at least a plurality of remaining segments of the first semiconductor layer laterally exposed by the removal of the STIs in the NMOS region. The PMOS fins and the NMOS fins are then reshaped. Thereafter, a cleaning process is performed to the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a dielectric layer disposed over the substrate; and
a fin structure disposed over the dielectric layer;
wherein:
the fin structure contains a semiconductor material;
wherein an interface between the substrate and the dielectric layer is oxidized; and
the dielectric layer disposed below the fin structure includes a lateral recess.

2. The semiconductor device of claim 1, wherein the semiconductor device includes a p-channel metal-oxide-semiconductor (PMOS) FinFET and an n-channel metal-oxide-semiconductor (NMOS) FinFET, and wherein the fin structure is an NMOS fin structure of the NMOS FinFET.

3. The semiconductor device of claim 2, wherein the PMOS FinFET includes:
a silicon germanium layer disposed over the substrate;
a silicon layer disposed over the silicon germanium layer; and
a PMOS fin structure disposed over the silicon layer, wherein the PMOS fin structure contains silicon germanium.

4. The semiconductor device of claim 1, wherein the fin structure includes a [551] surface or a [661] surface.

5. The semiconductor device of claim 1, wherein the fin structure includes a narrower top portion and a wider bottom portion.

6. The semiconductor device of claim 1, wherein:
the fin structure contains silicon; and
the dielectric layer includes a silicon germanium oxide layer disposed over the substrate and a silicon oxide layer disposed over the silicon germanium oxide layer.

7. A semiconductor device, comprising:
a p-channel metal-oxide-semiconductor (PMOS) FinFET that includes:
a substrate;
a silicon germanium layer disposed over the substrate;
a silicon layer disposed over the silicon germanium layer; and
a PMOS fin disposed over the silicon layer, wherein the PMOS fin contains silicon germanium; and
an n-channel metal-oxide-semiconductor (NMOS) FinFET that includes:
the substrate;
a silicon germanium oxide layer disposed over the substrate;
a silicon oxide layer disposed over the silicon germanium oxide layer; and
an NMOS fin disposed over the silicon oxide layer, wherein the NMOS fin contains silicon, and wherein the silicon germanium oxide layer and the silicon oxide layer collectively define a concave recess in a horizontal direction, the concave recess being partially disposed below the NMOS fin.

8. The semiconductor device of claim 7, wherein at least one of the PMOS fin and the NMOS fin includes a [551] surface or a [661] surface.

9. The semiconductor device of claim 7, wherein the PMOS fin and the NMOS fin each have bottom portions that are wider than top portions.

10. The semiconductor device of claim 7, wherein portions of the substrate below the silicon germanium oxide layer is oxidized.

11. A semiconductor device, comprising:
a substrate;
a dielectric layer disposed over the substrate; and
a fin structure disposed over the dielectric layer;
wherein:
the dielectric layer includes a silicon germanium oxide layer disposed over the substrate and a silicon oxide layer disposed over the silicon germanium oxide layer;
the fin structure contains a semiconductor material; and
the dielectric layer disposed below the fin structure includes a lateral recess.

12. The semiconductor device of claim 11, wherein the semiconductor device includes a p-channel metal-oxide-semiconductor (PMOS) FinFET including:
a silicon germanium layer disposed over the substrate;
a silicon layer disposed over the silicon germanium layer; and
a PMOS fin structure disposed over the silicon layer, wherein the PMOS fin structure contains silicon germanium.

13. The semiconductor device of claim 11 wherein the fin structure includes a [551] surface.

14. The semiconductor device of claim 11, wherein the fin structure includes a [661] surface.

15. The semiconductor device of claim 11, wherein the fin structure includes a narrower top portion and a wider bottom portion.

16. The semiconductor device of claim 11, wherein an interface between the substrate and the dielectric layer is oxidized.

17. The semiconductor device of claim 12, wherein the semiconductor device includes an n-channel metal-oxide-semiconductor (NMOS) FinFET including:
a silicon germanium oxide layer disposed over the substrate;
a silicon oxide layer disposed over the silicon germanium oxide layer; and
an NMOS fin structure disposed over the silicon oxide layer, wherein the NMOS fin contains silicon, and wherein the silicon germanium oxide layer and the silicon oxide layer collectively define a concave recess in a horizontal direction, the concave recess being partially disposed below the NMOS fin.

18. The semiconductor device of claim 17, wherein the PMOS fin and the NMOS fin each have bottom portions that are wider than top portions.

19. The semiconductor device of claim 17, wherein portions of the substrate below the silicon germanium oxide layer is oxidized.

20. The semiconductor device of claim 1, wherein the lateral recess has a curved profile in a cross-sectional view.

* * * * *